United States Patent
David et al.

(10) Patent No.: US 11,215,681 B2
(45) Date of Patent: Jan. 4, 2022

(54) MAGNETIC FIELD SENSOR WITH STRAY FIELD IMMUNITY AND LARGE AIR GAP PERFORMANCE

(71) Applicant: Allegro Microsystems, LLC, Manchester, NH (US)

(72) Inventors: Paul A. David, Bow, NH (US); Remy Lassalle-Balier, Bures sur Yvette (FR); Jeffrey Eagen, Manchester, NH (US); Damien Dehu, La-Ville-du-Bois (FR)

(73) Assignee: Allegro MicroSystems, LLC, Manchester, NH (US)

( * ) Notice: Subject to any disclaimer, the term of this patent is extended or adjusted under 35 U.S.C. 154(b) by 299 days.

(21) Appl. No.: 16/507,544

(22) Filed: Jul. 10, 2019

(65) Prior Publication Data
US 2021/0011097 A1     Jan. 14, 2021

(51) Int. Cl.
*G01R 33/07* (2006.01)
*G01R 15/20* (2006.01)
*G01R 33/09* (2006.01)

(52) U.S. Cl.
CPC ......... *G01R 33/077* (2013.01); *G01R 15/202* (2013.01); *G01R 15/205* (2013.01); *G01R 15/207* (2013.01); *G01R 33/09* (2013.01)

(58) Field of Classification Search
CPC .... G01R 33/077; G01R 15/02; G01R 33/202; G01R 33/205; G01R 33/09
See application file for complete search history.

(56) References Cited

U.S. PATENT DOCUMENTS

| 5,621,377 | A   | 4/1997  | Dettmann et al. |
| 9,103,657 | B2* | 8/2015  | Ruigrok ............ G01B 7/30 |
| 9,719,806 | B2  | 8/2017  | Foletto et al. |
| 9,823,092 | B2  | 11/2017 | David et al. |

(Continued)

FOREIGN PATENT DOCUMENTS

EP     2546611 A1     1/2013

OTHER PUBLICATIONS

Response to communication dated Jan. 25, 2021 and to the Extended European Search Report dated Dec. 21, 2020 for European Application No. 20182174.1; Response filed on Jul. 15, 2021; 23 Pages.

(Continued)

*Primary Examiner* — Reena Aurora
(74) *Attorney, Agent, or Firm* — Daly, Crowley, Mofford & Durkee, LLP

(57) ABSTRACT

A system includes a ring magnet having magnetic segments and configured to rotate about an axis of rotation, wherein adjacent segments have different magnetic polarities, The system can further include a substrate positioned so that a top surface of the substrate is substantially parallel to the axis of rotation and a center plane passing through the ring magnet and perpendicular to the axis of rotation of the ring magnet intersects the top surface at an intersection line. The system can further include four magnetic field sensing elements supported by the substrate and electrically coupled to form a first bridge circuit, wherein two of the four magnetic field sensing elements are positioned on one side of the intersection line and the other two of the four magnetic field sensing elements are positioned on the other side of the intersection line.

23 Claims, 6 Drawing Sheets

(56) References Cited

U.S. PATENT DOCUMENTS

| | | | |
|---|---|---|---|
| 10,254,103 | B2 | 4/2019 | Taylor et al. |
| 2003/0222642 | A1 | 12/2003 | Butzmann |
| 2011/0062537 | A1 | 3/2011 | Oh et al. |
| 2018/0216963 | A1* | 8/2018 | Uberti .................... G01D 5/145 |
| 2018/0238713 | A1 | 8/2018 | Metivier et al. |

OTHER PUBLICATIONS

U.S. Appl. No. 16/527,313, filed Jul. 31, 2019, Lassalle-Balier et al.
Extended European Search Report dated Dec. 21, 2020 for European Application No. 20182174.1; 8 pages.

* cited by examiner

MAGNETIC FIELD SENSOR WITH STRAY FIELD IMMUNITY AND LARGE AIR GAP PERFORMANCE

FIELD

This patent relates to magnetic field sensors and, more particularly, to magnetic field sensors with stray field immunity and large air gaps between the magnetic target and the magnetic field sensor.

BACKGROUND

Magnetic field sensors can be used in various types of devices to measure and monitor properties of systems in a wide variety of different applications. For example, sensors have become common in products that rely on electronics in their operation, such as motor control systems and automobile control systems. Common examples of motor control applications include detection of the position and/or rotation of a motor and common examples of automotive applications include detection of ignition timing from a position or rotation of an engine crankshaft and/or camshaft, detection of wheel speed for anti-lock braking systems and four-wheel steering systems, detection of window positioning, and other applications.

As an example, a target ring magnet may be placed at the end of a rotating shaft so that it rotates as the shaft rotates. A magnetic field sensor can be positioned within the magnetic field produced by the ring magnet to detect the rotation.

Many sensors must operate in the presence of external, stray magnetic fields that can interfere with the operation of the magnetic field sensor. Thus, it is beneficial if the magnetic field sensor has reduced sensitivity or immunity to the external field so that the output signal produced by the magnetic field sensor can more accurately reflect detection of the target.

Also, many magnetic field sensors must be placed near the target magnet. Magnetic field sensors that can operate with increased air gap distances between the magnetic field sensor and the target magnet may be beneficial in certain applications.

SUMMARY

The present invention can provide a magnetic field sensor that can operate with increased air gap distances between the magnetic field sensor and a target.

In accordance with an example useful for understanding an aspect of the present invention, a system includes a ring magnet having magnetic segments and configured to rotate about an axis of rotation, wherein adjacent segments have different magnetic polarities, The system can further include a substrate positioned so that a top surface of the substrate is substantially parallel to the axis of rotation and a center plane passing through the ring magnet and perpendicular to the axis of rotation of the ring magnet intersects the top surface at an intersection line. The system can further include four magnetic field sensing elements supported by the substrate and electrically coupled to form a first bridge circuit, wherein two of the four magnetic field sensing elements are positioned on one side of the intersection line and the other two of the four magnetic field sensing elements are positioned on the other side of the intersection line.

In accordance with another example useful for understanding another aspect of the present invention, a magnetic field sensor includes a substrate having a top surface; a first bridge circuit supported by the substrate comprising a first set of four magnetic field sensing elements; and a second bridge circuit supported by the substrate comprising a second set of four magnetic field sensing elements, wherein each of the magnetic field sensing elements each has an axis of maximum sensitivity and is positioned so that the respective axes of maximum sensitivity are substantially parallel to an axis of rotation of a target.

In accordance with another example useful for understanding another aspect of the present invention, a system includes a ring magnet having magnetic segments and configured to rotate about an axis of rotation, wherein adjacent segments have different magnetic polarities; a substrate positioned so that a top surface of the substrate is substantially parallel to the axis of rotation and a center plane passing through the ring magnet and perpendicular to the axis of rotation of the ring magnet intersects the top surface at an intersection line; and means for detecting the ring magnet and producing an output signal representing a state of the ring magnet.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR and TMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
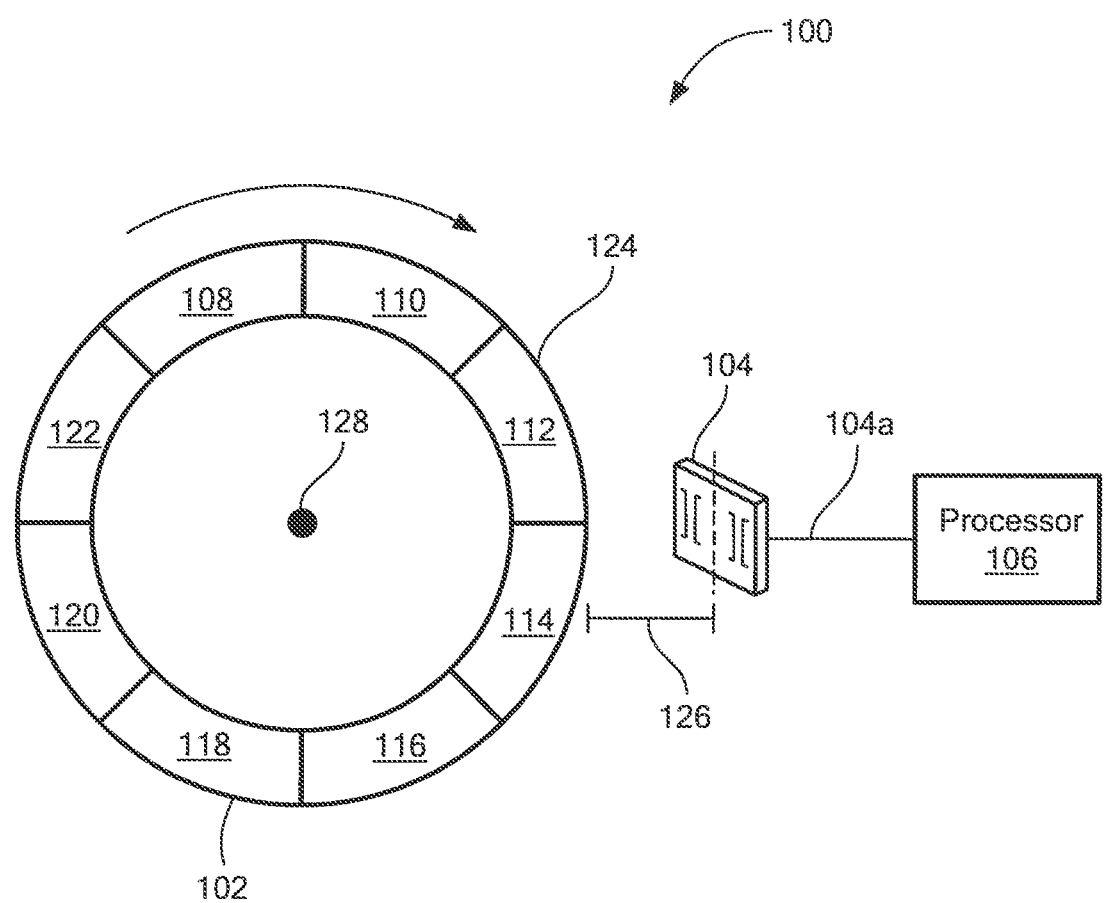
FIG. 1 is a block diagram of a magnetic field sensor system and a ring magnet target.

FIG. 1 is a block diagram of a system 100 for detecting a magnetic target 102.

System 100 includes a magnetic field sensor 104 to detect a magnetic field produced by target 102 and generate a signal 104a representing the detected field. Magnetic field sensor 104 may be coupled to a processing circuit 106. Processing circuit 106 may be a computer processor or other circuit that can receive signal 104a. In one example, magnetic field sensor 104 is an automotive magnetic field sensor associated with a vehicle's braking system and processing circuit 106 is an automotive computer that controls the braking system.

Target 102 may be a ring magnet having a plurality of sections 108-122. Sections 108-122 may be magnetic sources having alternating polarities. For example, the sections may be permanent magnets and the outer surface of section 108 may be polarized to magnetic north, the outer surface of section 110 may be magnetic south, etc. In other embodiments, some of the sections 108-122 may be magnetically neutral and may not generate a magnetic field. In either case, as target 102 rotates, magnetic field sensor 104 may detect a changing magnetic field due to the varying magnetic polarities of sections 108-122. Also, magnetic field sensor 104 may detect the transition of the magnetic field (e.g. from north to south, etc.) due to the changing polarities.

Ring magnet 102 may be positioned to have an axis of rotation 128 in a direction into or out of the page. Also, the shortest distance between magnetic field sensor 104 and target 102 may be defined by the outer surface 124 of target 102. This distance 126 may define the air gap between target 102 and magnetic field sensor 104.

Figure 2:
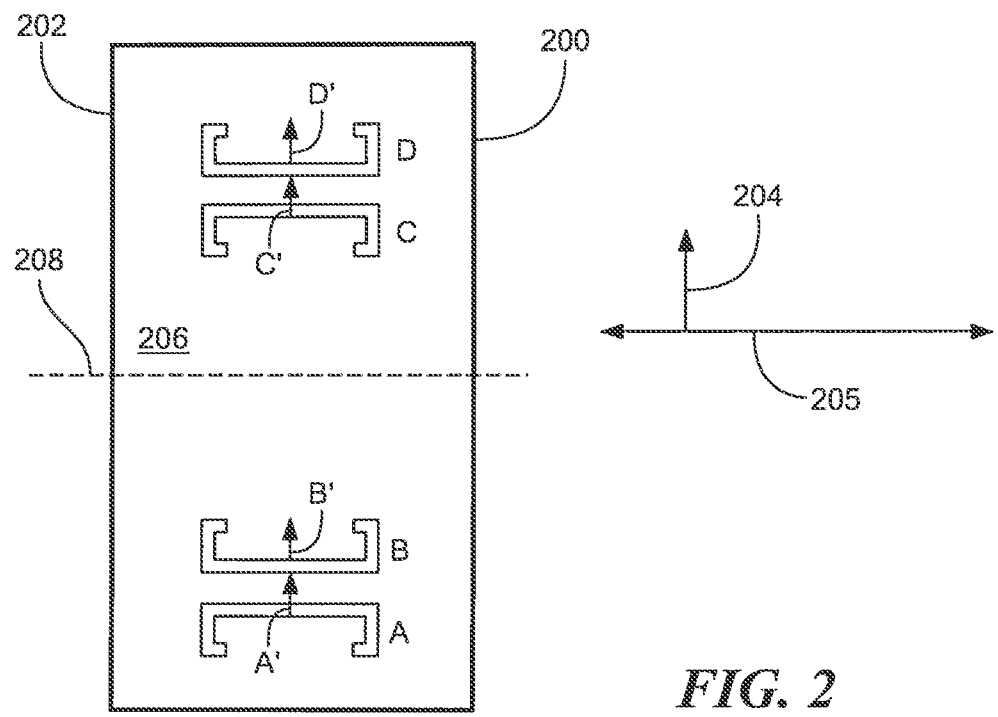
FIG. 2 is a layout diagram of a magnetic field sensor with magnetic field sensing elements.

Referring to FIG. 2, magnetic field sensor 200 may be the same as or similar to magnetic field sensor 104. Magnetic field sensor 200 may include a substrate 202 that supports a plurality of magnetic field sensing elements A, B, C, and D. Substrate 202 may be a semiconductor substrate such as silicon, a semiconducting ceramic, etc. In other embodiments, substrate 200 may be a printed circuit board substrate or the like. A "top" surface 206 of substrate 202 may form a plane that is substantially parallel to an axis of rotation 204 of the target 102, which can be the same as the axis of rotation 128.

Magnetic field sensing elements A-D may be magnetoresistance ("MR") elements each having an axis of maximum sensitivity indicated by arrows A', B', C' and D'. As shown, magnetic field sensing elements A-D may be positioned so that their axes of maximum sensitivity are roughly parallel to an axis of rotation 204 of target 104, which can be the same as the axis of rotation 128.

The circumference of ring magnet 102 defines a plane. In an embodiment, intersection line 208 is the intersection of that plane and substrate 200. Intersection line 208 can be upon a the "center plane" of target 102. Thus, magnetic field sensing elements A and B are located on one side of the center plane of the target 102 and magnetic field sensing elements C and D are located on the other side of the center plane of the target 102. The distance between target and surface 206 (e.g. distance 126 in FIG. 1) may be about 1.7 mm or greater.

Figure 2A:
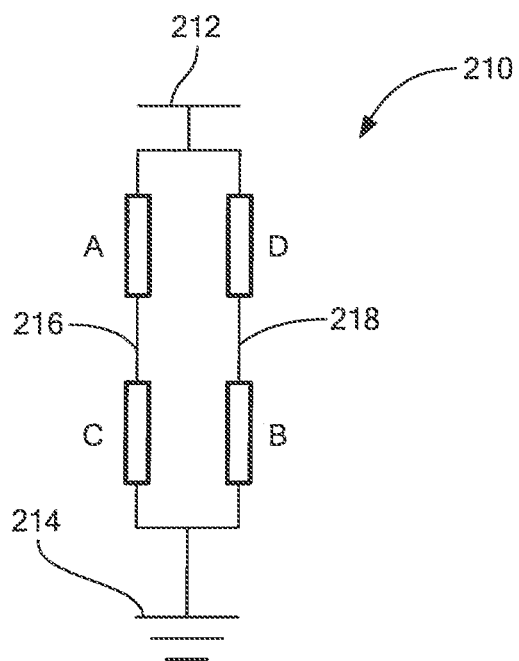
FIG. 2A is a circuit diagram of the magnetic field sensing elements of FIG. 2.

Referring to FIG. 2A, magnetic field sensing elements A-D may be electrically connected to form a bridge circuit 210, with magnetic field sensing elements A and C arranged in series from power 212 to ground 214 and magnetic field sensing elements D and B arranged in series from power 212 to ground 214. Bridge circuit 210 may generate a differential output signal between nodes 216 and 218 that represents the magnetic field as detected by bridge circuit 210.

Figure 3:
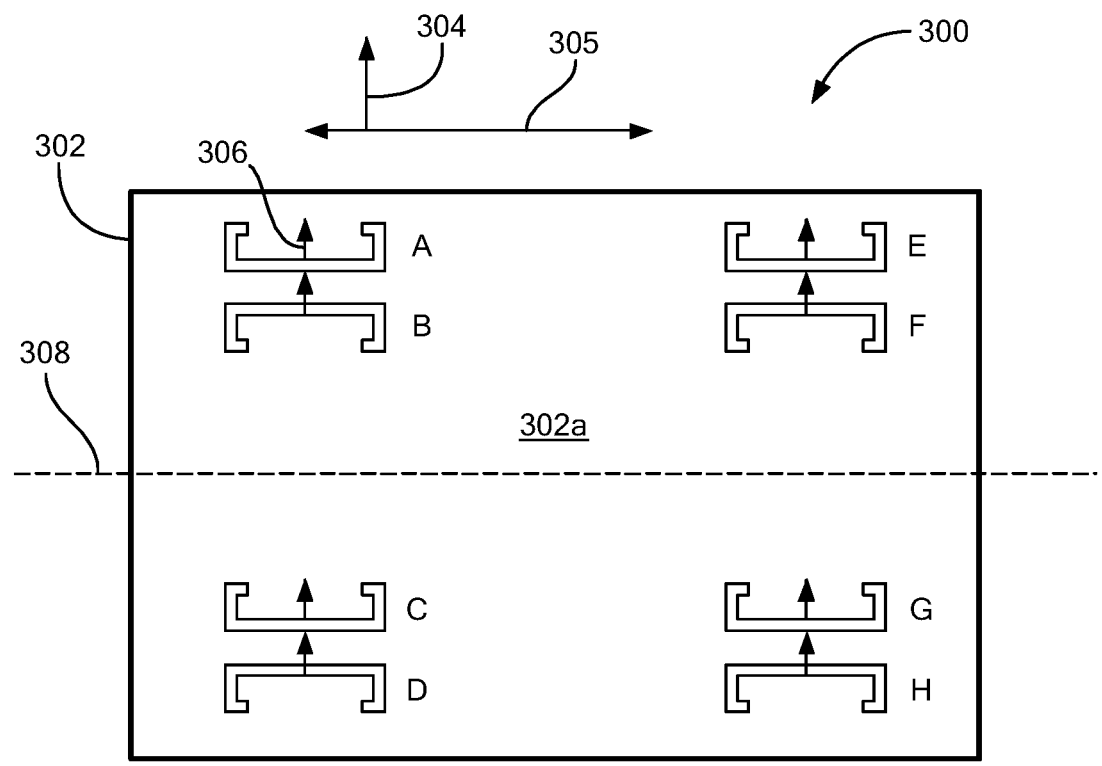
FIG. 3 is a layout diagram of another embodiment of a magnetic field sensor with magnetic field sensing elements.

Referring to FIG. 3, a magnetic field sensor magnetic field sensor 300 may include a substrate 302 that supports a plurality of magnetic field sensing elements A, B, C, D, E, F, G, and H. Substrate 302 may be a semiconductor substrate such as silicon, a semiconducting ceramic, etc. In other embodiments, substrate 302 may be a printed circuit board substrate or the like. A "top" surface 302a of substrate 302 may form a plane that is substantially parallel to the axis of rotation 304 of the target.

Magnetic field sensing elements A-H may be magnetoresistance ("MR") elements each having an axis of maximum sensitivity. Each axis of maximum sensitivity has a direction indicated by an arrow, such as arrow 306. Thus, as shown, magnetic field sensing elements A-H may be positioned so that their respective axes of maximum sensitivity are roughly parallel to the axis of rotation 304 of target 104.

Intersection line 308 may be defined as the intersection of the plane formed by surface 302a and the plane formed by the circumference of ring magnet 102. Accordingly, intersection line 308 is substantially perpendicular to the ring magnet's axis of rotation 304.

Magnetic field sensing elements A, B, E, and F may be positioned on surface 302a on one side of intersection line 308 and magnetic field sensing elements C, D, G, and H may be positioned on the other side of intersection line 306 so that ring magnet 102 is positioned in the center along intersection line 308.

Figure 3A:
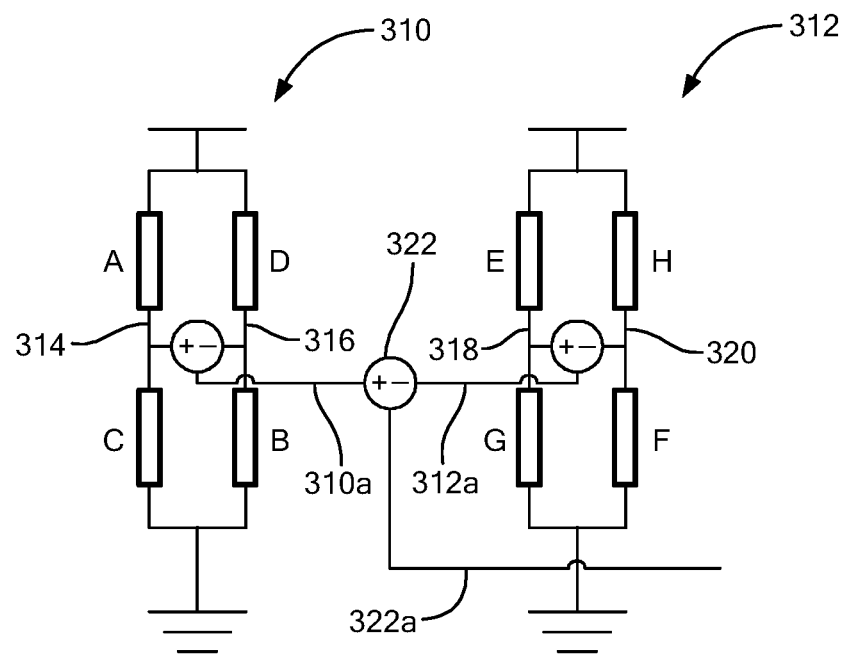
FIG. 3A is a circuit diagram of the magnetic field sensing elements of FIG. 3.

Referring to FIG. 3A, magnetic field sensing elements A-H may be electrically coupled to form two bridge circuits 310 and 312. Bridge circuit 310 may include magnetic field sensing elements A and C coupled in series between power and ground, and magnetic field sensing elements B and D coupled in series between power and ground. Similarly, bridge circuit 312 may include magnetic field sensing elements E and G coupled in series between power and ground, and magnetic field sensing elements H and F coupled in series between power and ground.

In operation, as ring magnet (target) 102 rotates, the magnetic field may affect the sensitivity of each of the magnetic field sensing elements A-H. For example, because the axes of maximum sensitivity of the magnetic field sensing elements are parallel to the ring magnet's axis of rotation (128, 204, or 304), and thus perpendicular to the direction of rotation (205 or 305) of the target 102, the magnetic field produced by the target 102 may affect the free layer along the bias direction (perpendicular to the arrows, e.g., 306) of the MR elements A-H rather than the most sensitive direction of the of the MR elements A-H (parallel to the arrows e.g., 306). By affecting the bias layer, the magnetic field produced by the target may alter the resistance of the MR elements A-H by changing their sensitivity to an external field rather than by directly changing the direction of the MR elements' free layer.

Considering bridge 310 for example, each of elements A, B, C, D experiences the same field along the bias. Elements A, B have the same field along the sensitive direction that is opposite to the field experienced by elements C, D. Vertical stray field (i.e., field along the direction of arrow 304) will affect elements A, B, C, and D in the same way because they have the same bias. Thus, such vertical stray field will not generate a signal at the output of the bridge 310. Similarly, for bridge 312, each of elements E, F, G, H experiences the same field along the bias. Elements E, F have the same field along the sensitive direction that is opposite to the field experienced by elements G, H. Vertical stray field (i.e., field along the direction of arrow 304) will affect elements E, F, G, H in the same way because they have the same bias. Thus, such vertical stray field will not generate a signal at the output of the bridge 312. However, horizontal stray field (i.e., field along the direction of arrow 305) will affect bridge 310 differently than it affects bridge 312. In particular, one bridge will lose sensitivity while the other may gain some sensitivity. Thus, once the signals from the bridges 310, 312 are combined, the output signal 322*a* will be substantially insensitive to the stray field.

Bridge circuit 310 may produce a differential output signal 310*a* which may be the difference between the voltages at nodes 314 and 316. Similarly, bridge 312 may produce a differential output signal 312*a* which may be the difference between the voltages at nodes 318 and 320. In embodiments, a difference circuit 322 receives output signals 310*a* and 312*a* and provides output signal 322*a*. Output signal 322*a* may be the difference between bridge output 310*a* and bridge output 312*a*. Output signal 322*a* may represent the magnetic field as detected by magnetic field sensing elements A-H and may be used to calculate angular position, rotational speed, rotational direction, acceleration, and other properties of target 102.

Figure 4:
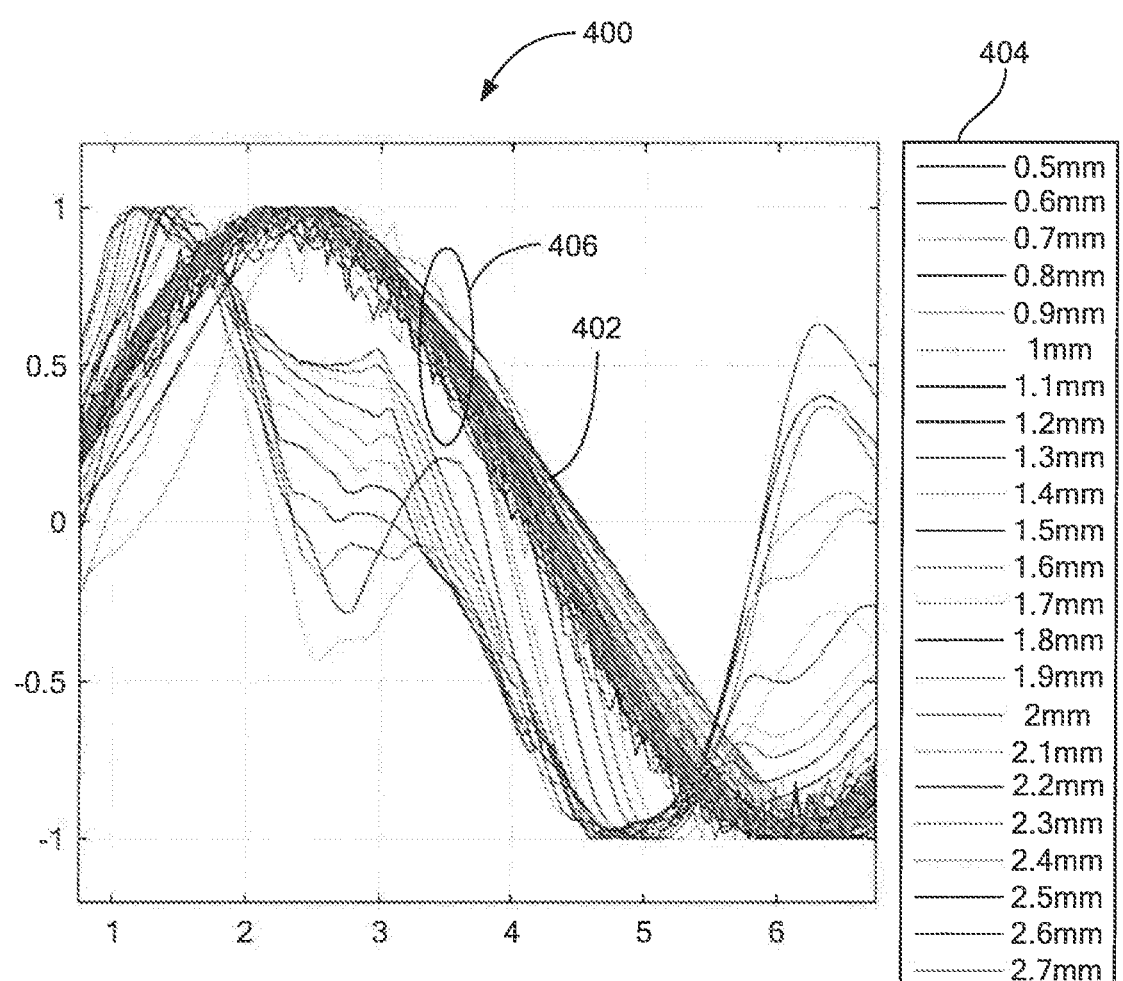
FIG. 4 is a graph of magnetic field sensor output v. target rotation angle.

Referring to FIG. 4, a graph 400 includes waveforms 402. The horizontal axis represents rotation of target 102 and the vertical axis represents the voltage of output signal 322*a*. Each waveform in the group of waveforms 402 may represent output signal 322*a* as measured with varying air gaps between target 102 and magnetic field sensor 300. Legend 404 includes a list of different air gaps associated with different waveforms 402.

In certain embodiments, magnetic field sensor 300 may operate with relatively high distortion through an air gap range of 0.5 mm or less to 2.2 mm or more, as shown by the group of waveforms 408.

Figure 5:
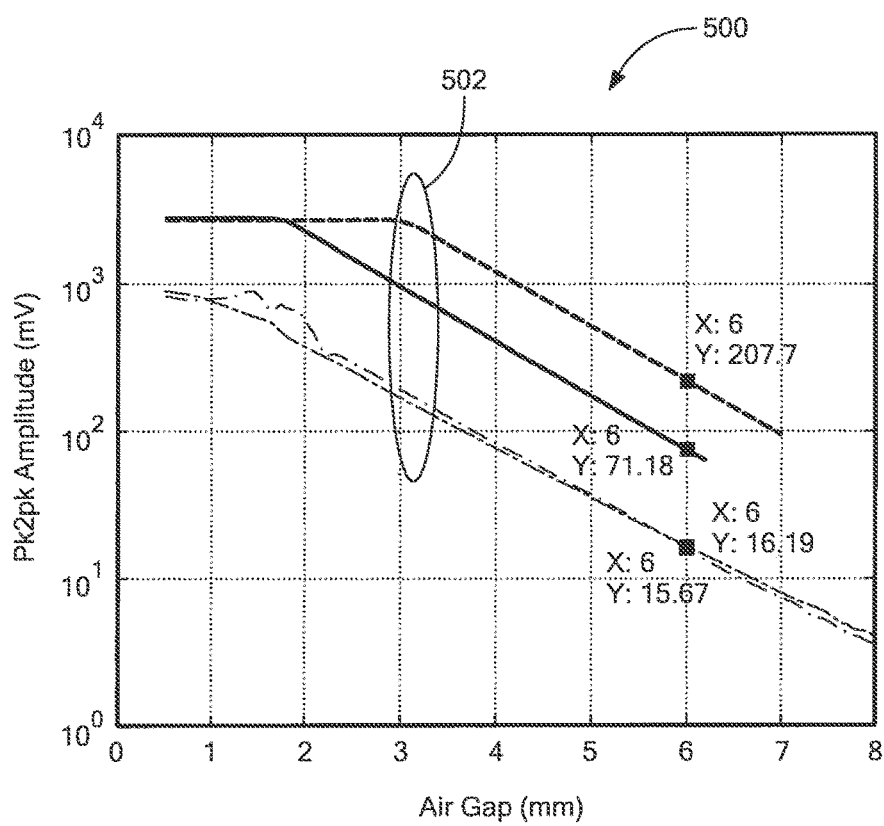
FIG. 5 is a graph of magnetic field sensor output v. air gap distance between the magnetic field sensor and the target.

Referring to FIG. 5, graph 500 illustrates the amplitude of signal 322*a* for various magnetic field sensors. The horizontal axis represents the air gap distance between target 102 and the magnetic field sensor and the vertical axis represents the peak-to-peak amplitude of output signal 322*a* in logarithmic units of millivolts. Waveforms 502 may represent the output voltage of signal 322*a* as measured for various physical arrangements of magnetic field sensing elements A-H. As shown, the various arrangements may provide a substantially 1/(air gap) outputs from about 1.7 mm airgap or less to 8 mm airgap or more.

Figure 6:
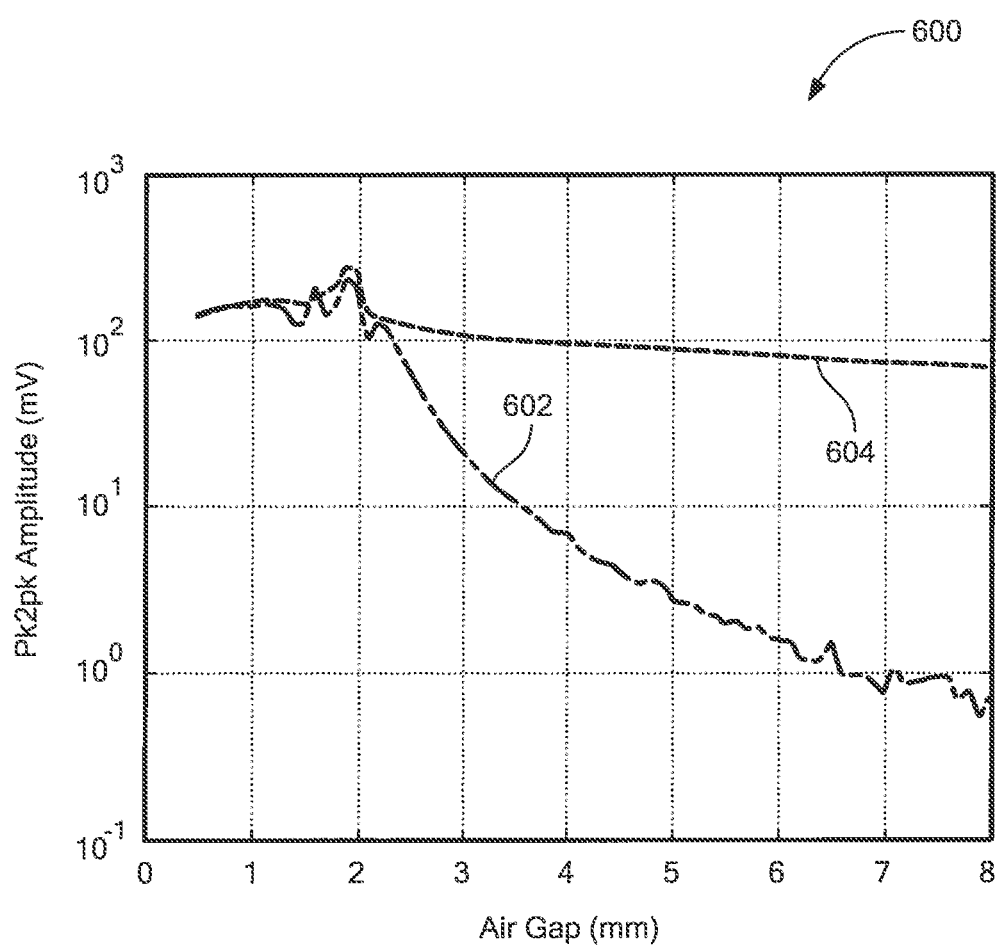
FIG. 6 is a graph of magnetic field sensor output v. air gap distance between the magnetic field sensor and the target.

Referring to FIG. 6, graph 600 illustrates the amplitude of signal 322*a* for various magnetic field sensors in the presence of a stray, external field interfering with the signal produced by the magnetic field sensor. The horizontal axis represents the air gap distance in millimeters between target 102 and the magnetic field sensor and the vertical axis represents the peak-to-peak amplitude in millivolts of the magnetic field sensor's output.

Waveform 602 represents the response of magnetic field sensor 300 to a stray, external magnetic field. Waveform 604 represents the response of a magnetic field sensor of the prior art to the same stray, external magnetic field. As shown, magnetic field sensor 300 is less sensitive to the stray, external magnetic field across all airgap distances of about 2 mm or higher. In other embodiments, magnetic field sensing elements A-H may be arranged so that magnetic field sensor 300 may provide reduced sensitivity or immunity to the stray field with air gaps less than about 2 mm.

Various embodiments are described in this patent. However, the scope of the patent should not be limited to the described embodiments, but rather should be limited only by the spirit and scope of the following claims. All references cited in this patent are incorporated by reference in their entirety.

The invention claimed is:

1. A system comprising:
a ring magnet having magnetic segments and configured to rotate about an axis of rotation, wherein adjacent segments have different magnetic polarities;
a substrate positioned so that a top surface of the substrate is substantially parallel to the axis of rotation and a center plane passing through the ring magnet and perpendicular to the axis of rotation of the ring magnet intersects the top surface at an intersection line; and
four magnetic field sensing elements supported by the substrate and electrically coupled to form a first bridge circuit, wherein two of the four magnetic field sensing elements are positioned on one side of the intersection line and the other two of the four magnetic field sensing elements are positioned on the other side of the intersection line, wherein each of the four magnetic field sensing elements has a respective axis of maximum sensitivity, wherein each of the four magnetic field sensing elements is arranged so that each respective axis of sensitivity is substantially parallel to the axis of rotation.

2. The system of claim 1 wherein the four magnetic field sensing elements are magnetoresistance elements.

3. The system of claim 1 wherein the four magnetic field sensing elements are arranged along a line that is substantially parallel to the axis of rotation.

4. The system of claim 1 wherein the ring magnet is positioned to create an air gap between the ring magnet and the substrate.

5. The system of claim 4, wherein the air gap is about 1.7 mm or greater.

6. The system of claim 1 further comprising four additional magnetic field sensing elements electrically coupled to form a second bridge circuit.

7. The system of claim 6 wherein two of the four additional magnetic field sensing elements are positioned on one side of the intersection line and the other two of the four additional magnetic field sensing elements are positioned on the other side of the intersection line.

8. The system of claim 6 wherein each of the four additional magnetic field sensing elements has a respective axis of maximum sensitivity, wherein each of the four additional magnetic field sensing elements is arranged so that each respective axis of sensitivity is substantially parallel to the axis of rotation.

9. The system of claim 8 wherein each one of the additional four magnetic field sensing elements has the same first direction of sensitivity.

10. The system of claim 6 wherein the four additional magnetic field sensing elements are magnetoresistance elements.

11. The system of claim 6 wherein the four additional magnetic field sensing elements are arranged along a line that is substantially parallel to the axis of rotation.

12. The system of claim 6 further comprising a circuit coupled to receive a first output signal from the first bridge circuit and a second output signal from the second bridge circuit.

13. The system of claim 12 wherein the circuit is configured to produce a difference signal representing an amplitude difference between the first output signal and the second output signal.

14. The system of claim 1 wherein each one of the four magnetic field sensing element has a same first direction of sensitivity.

15. A magnetic field sensor comprising:
   a substrate having a top surface substantially parallel to an axis of rotation of a target, wherein a center plane passing through the target and perpendicular to the axis of rotation of the target intersects the top surface at an intersection line;
   a first bridge circuit supported by the top surface of the substrate, the first bridge circuit comprising a first set of four magnetic field sensing elements; and
   a second bridge circuit supported by the top surface of the substrate, the second bridge circuit comprising a second set of four magnetic field sensing elements;
   wherein:
   each of the magnetic field sensing elements each has a respective axis of maximum sensitivity, wherein each of the magnetic field sensing elements is positioned so that the respective axes of maximum sensitivity are substantially parallel to the axis of rotation of the target.

16. The magnetic field sensor of claim 15 wherein:
   the top surface is divided into a four quadrants;
   two of the first set of four magnetic field sensing elements are positioned in a first quadrant of the four quadrants;
   the other two of the first set of magnetic field sensing elements are positioned in a second quadrant of the four quadrants;
   two of the second set of four magnetic field sensing elements are positioned in a third quadrant of the four quadrants; and
   the other two of the second set of magnetic field sensing elements are positioned in a fourth quadrant of the four quadrants.

17. The magnetic field sensor of claim 16 wherein the first and third quadrants are positioned on one side of the intersection line and the second and fourth quadrants are positioned on the other side of the intersection line.

18. The magnetic field sensor of claim 15 further comprising a circuit coupled to receive a first output signal from the first bridge circuit and a second output signal from the second bridge circuit.

19. The magnetic field sensor of claim 18 wherein the circuit is configured to produce a difference signal representing an amplitude difference between the first output signal and the second output signal.

20. The magnetic field sensor of claim 15 wherein the target is a ring magnet.

21. The system of claim 15 wherein each of the magnetic field sensing elements has the same direction of sensitivity.

22. A system comprising:
   a substrate having a top surface substantially parallel to an axis of rotation of a target;
   a first bridge circuit supported by the top surface of the substrate, the first bridge circuit comprising a first set of four magnetic field sensing elements;
   a second bridge circuit supported by the top surface of the substrate, the second bridge circuit comprising a second set of four magnetic field sensing elements;
   wherein each of the magnetic field sensing elements each has a respective axis of maximum sensitivity, wherein each of the magnetic field sensing elements is positioned so that the respective axes of maximum sensitivity are substantially parallel to the axis of rotation of the target, and
   means for using the first and second bridge circuits to produce an output signal representing a state of the target.

23. The system of claim 22 wherein each of magnetic field sensing elements has the same direction of sensitivity.

* * * * *